(12) United States Patent
Cabrera

(10) Patent No.: US 11,796,576 B1
(45) Date of Patent: Oct. 24, 2023

(54) WATT METER FOR ELECTRICAL PANELS

(71) Applicant: Reynaldo Cabrera, Lancaster, PA (US)

(72) Inventor: Reynaldo Cabrera, Lancaster, PA (US)

(*) Notice: Subject to any disclaimer, the term of this patent is extended or adjusted under 35 U.S.C. 154(b) by 0 days.

(21) Appl. No.: 17/972,857

(22) Filed: Oct. 25, 2022

(51) Int. Cl.
*G01R 22/06* (2006.01)

(52) U.S. Cl.
CPC .................. *G01R 22/065* (2013.01)

(58) Field of Classification Search
CPC ...... G01R 22/00; G01R 22/06; G01R 22/061; G01R 22/065; G01R 21/00; G01R 21/133
See application file for complete search history.

(56) References Cited

U.S. PATENT DOCUMENTS

| | | | |
|---|---|---|---|
| 9,794,654 B2 | 10/2017 | Roh et al. | |
| 10,175,276 B2* | 1/2019 | Fishburn | G01R 21/133 |
| 10,598,707 B2* | 3/2020 | Liu | G01R 21/1335 |
| 10,658,842 B2 | 5/2020 | Petrosyan | |
| 2005/0065743 A1* | 3/2005 | Cumming | G01R 22/10 |
| | | | 702/62 |
| 2013/0198245 A1* | 8/2013 | Kagan | G06F 16/13 |
| | | | 707/812 |
| 2014/0084836 A1* | 3/2014 | Pham | H02P 25/04 |
| | | | 318/490 |
| 2014/0158422 A1* | 6/2014 | Fan | H02G 3/22 |
| | | | 174/650 |
| 2016/0146866 A1* | 5/2016 | Houlette | G01R 21/133 |
| | | | 702/62 |
| 2016/0187396 A1* | 6/2016 | Beiner | H02B 1/42 |
| | | | 361/652 |
| 2017/0242059 A1* | 8/2017 | Parker | G01R 21/006 |
| 2018/0196094 A1* | 7/2018 | Fishburn | G01R 21/133 |
| 2022/0397592 A1* | 12/2022 | Olson | G01R 22/065 |

* cited by examiner

*Primary Examiner* — Huy Q Phan
*Assistant Examiner* — David B Frederiksen
(74) *Attorney, Agent, or Firm* — SANCHELIMA & ASSOCIATES, P.A.; Christian Sanchelima; Jesus Sanchelima

(57) ABSTRACT

A watt meter for electrical panels including a housing assembly, a power quality assembly and an electric assembly. Housing assembly includes a housing, wherein said housing is a cabinet suitable for electric components. The housing includes an opening in a front side thereof. Power quality assembly includes a power quality analyzer housed inside the housing, wherein the display of the power quality analyzer is placed parallel to the opening allowing the user to see the actual kilowatt hours being consumed, instant power, current, voltage, frequency and power factor. Electric assembly includes a capacitor device with a predetermined capacitance and a transformer device wherein are operatively connected to the residential power supply and to the power quality analyzer.

1 Claim, 3 Drawing Sheets

WATT METER FOR ELECTRICAL PANELS

1. FIELD OF THE INVENTION

The present invention relates to a watt meter and, more particularly, to a wattmeter for electrical panels that connects to the main power panel of a residence allowing to reduce electric energy consumption.

2. DESCRIPTION OF THE RELATED ART

Several designs for wattmeters have been designed in the past. None of them, however, include a digital display device that is coupled to the wires of an electric panel of a residence which is used to provide the user information about the domestic power consumption.

Applicant believes that a related reference corresponds to U.S. Pat. No. 10,658,842 issued for assembly, system and method for distributing, monitoring, and controlling electrical power. Applicant believes that another related reference corresponds to U.S. Pat. No. 9,794,654 issued for power metering system, method and system for monitoring power consumed by load. None of these references, however, teach of a watt meter for main electrical panels that is comprised of a digital display device that is coupled to the power supply wires in a main electrical panel which is used to provide the user with information on the power usage such as the kilowatt hours being consumed.

Other documents describing the closest subject matter provide for a number of more or less complicated features that fail to solve the problem in an efficient and economical way. None of these patents suggest the novel features of the present invention.

SUMMARY OF THE INVENTION

It is one of the objects of the present invention to reduce the kilowatt-hour cost.

It is another object of this invention to provide a device easy to install in an electric panel of a residence.

It is still another object of the present invention to provide information of kilowatt hours being consumed, instant power, current, voltage, frequency, power factor at the same time.

It is yet another object of this invention to provide such a device that is inexpensive to implement and maintain while retaining its effectiveness.

Further objects of the invention will be brought out in the following part of the specification, wherein detailed description is for the purpose of fully disclosing the invention without placing limitations thereon.

BRIEF DESCRIPTION OF THE DRAWINGS

With the above and other related objects in view, the invention consists in the details of construction and combination of parts as will be more fully understood from the following description, when read in conjunction with the accompanying drawings in which.

DETAILED DESCRIPTION OF THE EMBODIMENTS OF THE INVENTION

Figure 1:
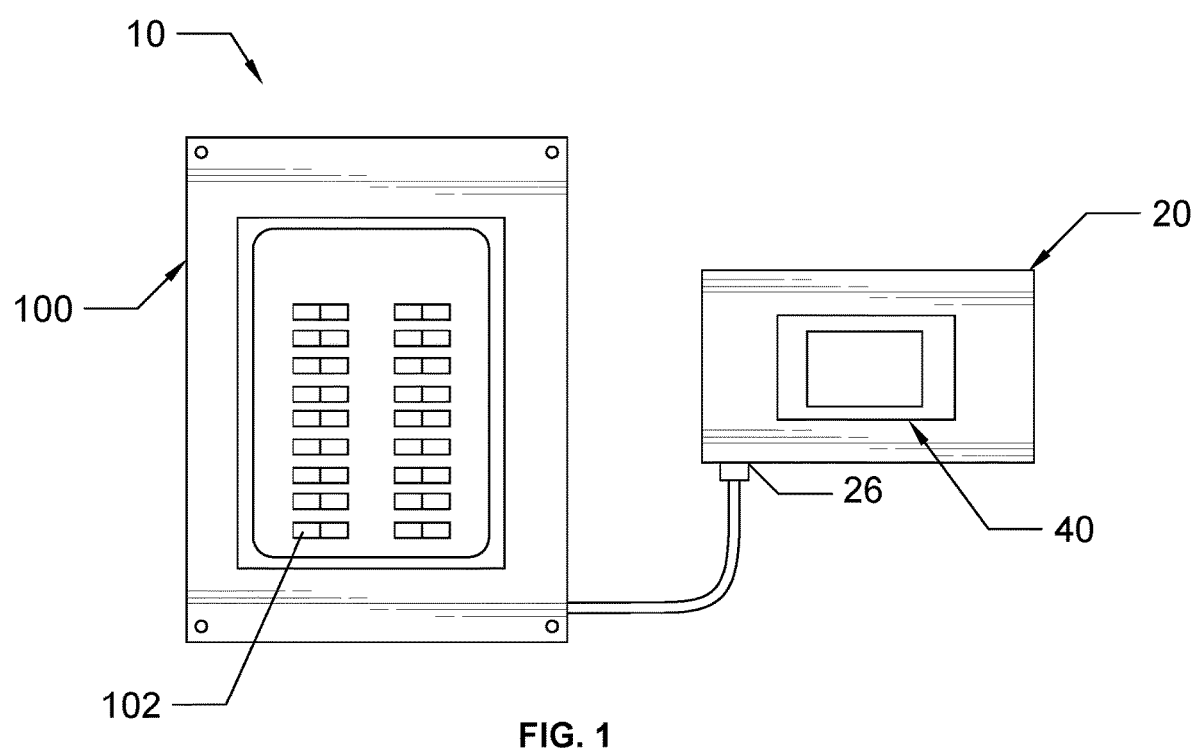
FIG. 1 represents an operational view of an exemplary embodiment of the present invention 10.

Referring now to the drawings, where the present invention is generally referred to with numeral 10, it can be observed that it basically includes a housing assembly 20, a power quality assembly 40, an electric assembly 60 and various exemplary embodiments (100) thereof. It should be understood there are modifications and variations of the invention that are too numerous to be listed but that all fit within the scope of the invention. Also, singular words should be read as plural and vice versa and masculine as feminine and vice versa, where appropriate, and alternative embodiments do not necessarily imply that the two are mutually exclusive.

Housing assembly 20 includes a housing 22 and a lid 24, wherein said housing 22 may have a cuboid shape with a hollow body. In an exemplary embodiment, housing 22 may be a cabinet for electrical equipment, electronic equipment or any other variation known in the art. In a suitable embodiment, housing 22 may be made of rigid plastics, a steel material, an aluminum material, a polycarbonate material, a fiberglass material or any other suitable material known in prior art. In one embodiment, housing 22 may have an opening 26 in a bottommost edge of the housing 22. Nevertheless, it should be considered that the opening 26 may be placed in a portion of any sides of the housing 22. In a preferred embodiment, the opening 26 may have a suitable area for electrical wires from the electrical panel 100 may pass through the opening 26 to the interior of the housing 22. Best depicted in FIG. 1. It should be considered that the electrical wires may be secured by means of a cable connector attached to the opening 26. In an exemplary embodiment, housing 22 may include a lid 24, wherein said lid conforms with the shape of the front side of the housing 22. The lid 24 may be an independent element that may be attached and detached from the housing 22 by means of fasteners. Nonetheless, it should be considered that the lid 26 may be hingedly attached to the housing 22, wherein the lid 26 may have an open and a close configuration. In a preferred embodiment, the lid 26 may have a lid opening 28, wherein the lid opening 28 may be placed in a front portion of the lid 24. The lid opening 28 may have a suitable area for a display device of a power quality analyzer 42 housed inside the housing 22 may be visible for a user.

Figure 2:
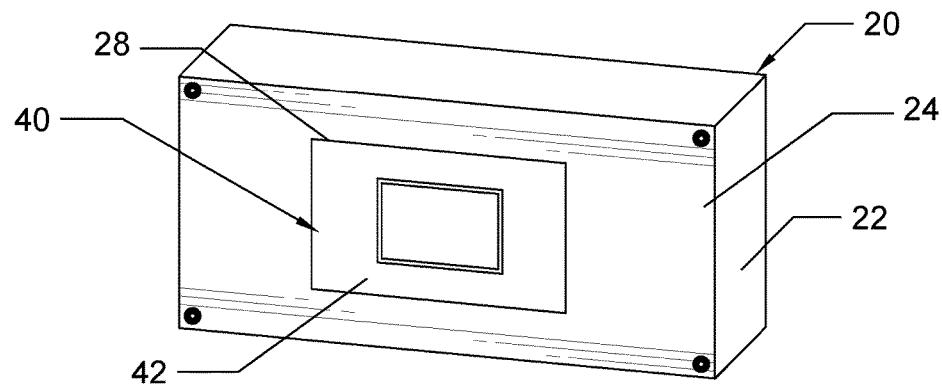
FIG. 2 shows an isometric view of the housing assembly 20, wherein the display of the power quality analyzer 42 is visible to the user.

Power quality assembly 40 includes a power quality analyzer 42, wherein the power quality analyzer 42 may be housed inside the housing 22. In a preferred embodiment, the power quality analyzer 42 may be an electrical measuring device, wherein may include a display device in a front portion thereof. In a suitable embodiment, power quality analyzer 42 may measure voltage, current, active power, cumulative energy, frequency and power factor at the same time from a home energy consumption. It should be considered that power quality analyzer 42 may have a variable electrical measuring range according to the parameters of the utility power wherein may be installed. In a suitable embodiment, power quality analyzer 42 may be operatively connected to the power supply 10 that comes from the electric panel 100, wherein the wires that provide electrical power may pass through the opening 26 and may be connected to the power quality analyzer 42, thereby the display device of the power quality analyzer 42 placed parallel to the lid 24 and centered with respect to the lid opening 28, may provide visual indicia to the user of the home energy being consumed. As shown in FIG. 2. It should be considered that the display device of the power quality analyzer 42 may protrude from the lid 24.

Figure 4:
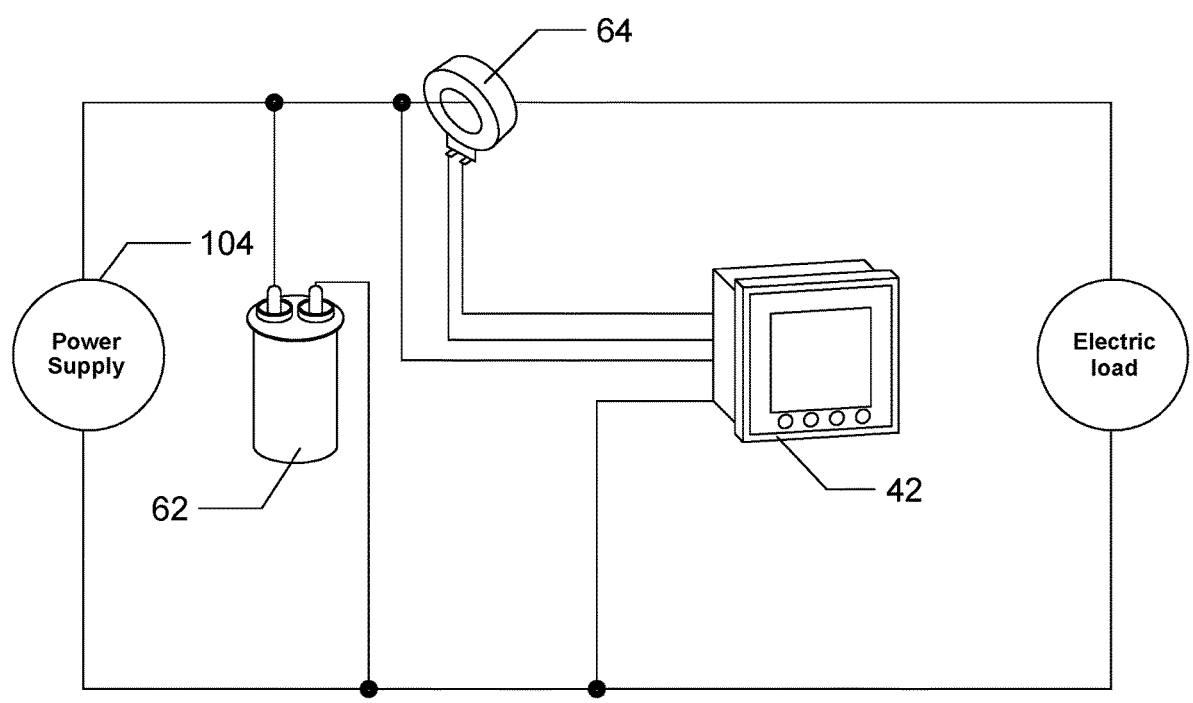
FIG. 4 is a representation of a diagram of the components of the present invention 10 electrically connected therebetween.

Electric assembly 60 includes a capacitor device 62 and a transformer device 64. In an exemplary embodiment, capacitor device 62 may be a star capacitor, a run capacitor, a dual run capacitor or any other variation thereof. The capacitor device 62 may be operatively connected to between the power supply and the power quality analyzer 42, wherein the capacitor device 62 may be connected in a parallel configuration. In a preferred embodiment, the capacitor device 62 may have a suitable calculated capacitance for the electrical parameters of the home energy. In a suitable embodiment, the capacitor device 62 may be housed inside of the housing, nevertheless, it should be considered that the capacitor device 62 may be placed outside of the housing. In other embodiment, transformer device 64 may be a window current transformer, a bar current transformer, a wound current transformer or any other variation thereof. The transformer device 64 may have a window, wherein a wire from the power supply 104 may pass through thereof, thereby the transformer device may be connected in a portion of a wire of the power supply 104 and being operatively connected to the power quality analyzer 42. As best illustrated in FIG. 4. It should be considered that transformer device 64 may have a split core, wherein a top portion of the transformer device 64 may be removeable or hingedly attached to a bottom portion of the transformer device 64 for easy installation without disconnecting wires or interrupting the home energy.

Figure 3:
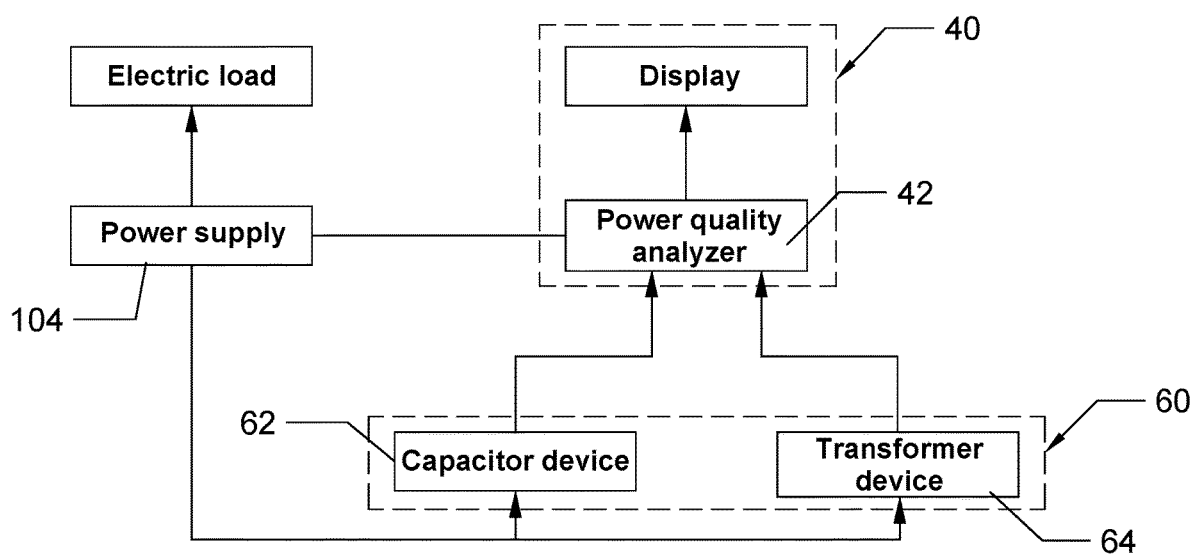
FIG. 3 illustrates a diagram of the power quality assembly 40 operatively connected to the power supply 104, the capacitor device 62 and the transformer device 64.

Referring to the FIG. 3, power supply 104 may come from the utility power, wherein is distributed by means of the electrical panel 100 to the electric load or electrical appliances. Power quality assembly 20 is powered by said power supply, wherein the capacitor device 62 and the transformer device 64 are operatively connected from the power supply 104 to the power quality analyzer, thereby the transformer device 62 may measure the consumed current and the capacitor device 62 may accumulate an energetic charge from the power supply 104 and store it, thereby the capacitor device 62 may release the energetic charge whenever is required by the electric load allowing the home energy consumption being reduced. It should be considered that power quality assembly 40 and electric assembly 60 may be protected by an electrical safety device 102 operatively connected to the power supply 104 inside the electric panel 100.

The foregoing description conveys the best understanding of the objectives and advantages of the present invention. Different embodiments may be made of the inventive concept of this invention. It is to be understood that all matter disclosed herein is to be interpreted merely as illustrative, and not in a limiting sense.

What is claimed is:

1. A watt meter for electrical panels, consisting of:
a housing assembly including a housing, and a lid wherein said housing is an electric cabinet, said housing includes an opening in at least one side thereof, wherein said opening has an area where a phase line and a neutral pass through thereof to the interior of said housing, said lid conforms with a shape of a front side of said housing, said lid is attached and detached from said housing by means of fasteners, said lid has a lid opening in a front side thereof said opening has an area that conforms with the front side of a power quality analyzer;
a power quality assembly having a power quality analyzer, wherein said power quality analyzer has a display device in a portion of a front side thereof, said power quality analyzer is housed inside said housing wherein said display protrudes from said lid opening, said power quality analyzer measure a voltage magnitude, a current magnitude, an active power magnitude, a cumulative energy magnitude, a frequency magnitude and a power factor magnitude, said magnitudes described above are displayed on said display device, wherein said power quality analyzer is operatively connected to a power supply; and
an electric assembly including a capacitor device and a transformer device, wherein said capacitor device is operatively connected in parallel to said power supply, said capacitor device is a run capacitor, said run capacitor has a predetermined capacitance, said transformer device is a current transformer, said transformer device has a split coil hingedly attached, a periphery of said transformer device surrounds a wire of said power supply while operatively connected to said power quality analyzer.

* * * * *